(12) United States Patent
Hsieh

(10) Patent No.: US 11,114,558 B2
(45) Date of Patent: Sep. 7, 2021

(54) SHIELDED GATE TRENCH MOSFET INTEGRATED WITH SUPER BARRIER RECTIFIER

(71) Applicant: Nami MOS CO., LTD., New Taipei (TW)

(72) Inventor: Fu-Yuan Hsieh, New Taipei (TW)

(73) Assignee: NAMI MOS CO., LTD., New Taipei (TW)

( * ) Notice: Subject to any disclaimer, the term of this patent is extended or adjusted under 35 U.S.C. 154(b) by 0 days.

(21) Appl. No.: 16/656,671

(22) Filed: Oct. 18, 2019

(65) Prior Publication Data

US 2021/0119030 A1    Apr. 22, 2021

(51) Int. Cl.
| | | |
|---|---|---|
| H01L 29/78 | (2006.01) | |
| H01L 29/10 | (2006.01) | |
| H01L 29/40 | (2006.01) | |
| H01L 29/423 | (2006.01) | |
| H01L 29/43 | (2006.01) | |
| H01L 29/47 | (2006.01) | |
| H01L 31/112 | (2006.01) | |
| H01L 29/87 | (2006.01) | |

(52) U.S. Cl.
CPC ...... *H01L 29/7804* (2013.01); *H01L 29/1095* (2013.01); *H01L 29/407* (2013.01); *H01L 29/4236* (2013.01); *H01L 29/435* (2013.01); *H01L 29/47* (2013.01); *H01L 29/87* (2013.01); *H01L 31/1121* (2013.01); *H01L 2924/14* (2013.01)

(58) Field of Classification Search
CPC . H01L 29/7813; H01L 29/78; H01L 29/7806; H01L 29/47; H01L 29/425; H01L 2924/11; H01L 27/02; H01L 31/1121; H01L 31/07; H01L 29/7804; H01L 29/407; H01L 29/1095; H01L 29/87; H01L 29/4236; H01L 29/7825; H01L 29/6613

See application file for complete search history.

(56) References Cited

U.S. PATENT DOCUMENTS

| | | | |
|---|---|---|---|
| 7,626,231 B1* | 12/2009 | Hsieh | H01L 29/872 257/334 |
| 7,750,412 B2* | 7/2010 | Rinehimer | H01L 29/7806 257/371 |
| 8,274,113 B1* | 9/2012 | Hsieh | H01L 29/42372 257/334 |
| 8,564,047 B2* | 10/2013 | Hsieh | H01L 29/866 257/328 |
| 8,816,348 B2* | 8/2014 | Hsieh | H01L 29/7806 257/66 |
| 9,716,009 B2 | 7/2017 | Kobayashi et al. | |
| 2007/0221952 A1* | 9/2007 | Thorup | H01L 29/66734 257/155 |

* cited by examiner

*Primary Examiner* — Galina G Yushina
(74) *Attorney, Agent, or Firm* — Bacon & Thomas, PLLC

(57) ABSTRACT

An integrated circuit comprising a surrounding gate transistor (SGT) MOSFET and a super barrier rectifier (SBR) is disclosed. The SBR horizontally disposed in different areas to the SGT MOSFET on single chip creates a low potential barrier for majority carrier in MOS channel, therefore has lower forward voltage and reverse leakage current than conventional Schottky Barrier Rectifier. Moreover, in some preferred embodiment, a multiple stepped oxide (MSO) structure is applied to the shielded gate structure to further reduce the on-resistance.

8 Claims, 17 Drawing Sheets

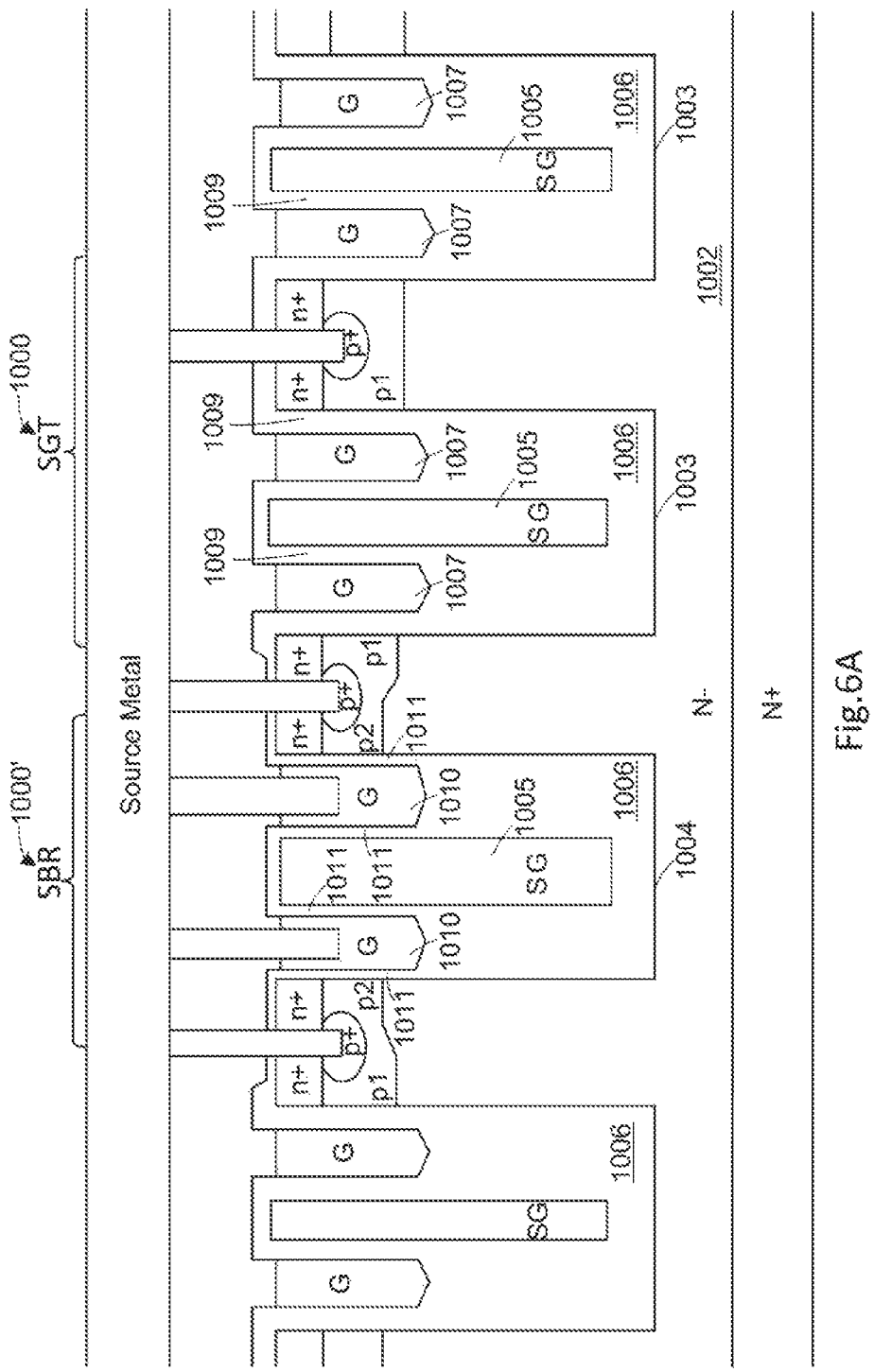

SHIELDED GATE TRENCH MOSFET INTEGRATED WITH SUPER BARRIER RECTIFIER

FIELD OF THE INVENTION

This invention relates generally to semiconductor devices, and more particularly, to a shielded gate trench MOSFET (Metal Oxide Semiconductor Field Effect Transistor) integrated with SBR (Super Barrier Rectifier) structure to achieve lower on-resistance with less switching loss.

BACKGROUND OF THE INVENTION

Please refer to FIG. 1A and FIG. 1B for two typical types of shielded gate trench MOSFET (SGT) structure, compared with a traditional single gate trench MOSFET, a shielded gate trench MOSFET is more attractive due to its lower gate charge and on-resistance as results of existence of charge couple region in drift region and thick oxide underneath gate oxide.

To further reduce the on-resistance, a new SGT structure with multiple stepped oxide (MSO) is disclosed in U.S. Pat. No. 9,716,009 as shown in FIG. 1C, with specific on-resistance about 25% lower than the SGT MOSFETs as shown in FIG. 1A and FIG. 1B. The MSO structure has multiple small stepped oxide film and stepped single domain polycrystalline-silicon field plate in the trench, by optimizing the length and width of the steps, the MSO structure can achieve a lower on-resistance at a same breakdown voltage as the conventional field plate MOSFET.

However, the above three prior arts still encounter high Qrr (reverse recovery charge) issue as result of parasitic body diode existence, which will result in high switching loss.

Therefore, there is still a need in the art of the semiconductor device design and fabrication, particularly for SGT MOSFET design and fabrication, to provide a novel cell structure, device configuration and manufacturing process that making a SGT MOSFET have lower on-resistance and lower switching loss.

SUMMARY OF THE INVENTION

The present invention provides a SGT MOSFET integrated with a super barrier rectifier (SBR) on single chip for reducing the switching loss. The integrated SBR creates a low potential barrier for majority carrier in MOS channel, which is adjustable by gate oxide thickness, body doping concentration and channel length. The SBR has lower forward voltage Vf and lower reverse leakage current Ir than Schottky Barrier rectifier. Meanwhile, the SBR has better and reliable performance at elevated temperature than the conventional Schottky Barrier rectifier.

According to one aspect, the invention features an integrated circuit comprising a SGT MOSFET and a SBR horizontally disposed in two different areas on single chip, further comprising: an epitaxial layer of a first conductivity type extending over a substrate of the first conductivity type, the substrate having a higher doping concentration than the epitaxial layer; the SGT MOSFET further comprising: a plurality of first type trenches formed in the epitaxial layer, each of the first type trenches being filled with a shielded electrode and a first gate electrode, the shielded electrode being insulated from the epitaxial layer by a first insulating film, the first gate electrode being insulated from the epitaxial layer by a first gate oxide film, the shielded electrode and the first gate electrode being insulated from each other; a first body region of a second conductivity type having a source region of the first conductivity type thereon and surrounding the first gate electrode padded by the first gate oxide film; the SBR further comprising: at least one second type trench formed in parallel with the first type trenches, the second type trench being filled with the shielded electrode and a second gate electrode, the shielded electrode being insulated from the epitaxial layer by the first insulating film, the second gate electrode being insulated from the epitaxial layer by a second gate oxide film, the shielded electrode and the second gate electrode being insulated from each other; the second gate oxide film having a thickness less than the first gate oxide film; a second body region of the second conductivity type having the source region thereon and surrounding the second gate electrode padded by the second gate oxide film; and the first body region, the second body region, the source region and the second gate electrode being shorted to a source metal through a plurality of trenched contacts.

According to another aspect, the body region in the SBR can have shallower junction depth and lower doping concentration than that in the SGT MOSFET to provide a short channel length to make the SBR an effective rectifier. Therefore, in some preferred embodiments, the second body region has shallower junction depth and lower doping concentration than the first body region. In some other preferred embodiments, the second body region has same junction depth and same doping concentration as the first body region.

According to another aspect of the present invention, in some preferred embodiments, the epitaxial layer comprises a single epitaxial layer having uniform doping concentration. In some other preferred embodiments, the epitaxial layer comprises a lower epitaxial layer with a resistivity R1 and an upper epitaxial layer with a resistivity R2, wherein R1>R2, the first and second type trenches are penetrating through the upper epitaxial layer and extending into the lower epitaxial layer. In some other preferred embodiments, the epitaxial layer further comprises an implanted drift region of the first conductivity type formed in upper portion of the epitaxial layer, the first and second type trenches are extending within the implanted drift region.

According to another aspect of the present invention, in some preferred embodiments, within each of the first type trenches, the shielded electrode is disposed in lower portion and the first gate electrode is disposed in upper portion, the shielded electrode and the first gate electrode is insulated from each other by a second insulating film; within the second type trench, the shielded electrode is disposed in lower portion and the second gate electrode is disposed in upper portion, the shielded electrode and the second gate electrode is insulated from each other by the second insulating film. In some other preferred embodiments, within each of the first type trenches, the shielded electrode is disposed in the middle and the first gate electrode is disposed surrounding upper portion of the shielded electrode, the shielded electrode and the first gate electrode is insulated from each other by the first gate oxide film; within the second type trench, the shielded electrode is disposed in the middle and the second gate electrode is disposed surrounding upper portion of the shielded electrode, the shielded electrode and the second gate electrode is insulated from each other by the second gate oxide.

According to another aspect of the present invention, in some preferred embodiments, the first insulating film is a single oxide film having uniform thickness. In some other preferred embodiments, the first insulating film has multiple stepped oxide structure having greatest thickness along bottom of the first and second type trenches.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description serve to explain the principles of the invention. In the drawings:

FIG. 6A is a cross-sectional view of another preferred embodiment according to the present invention.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
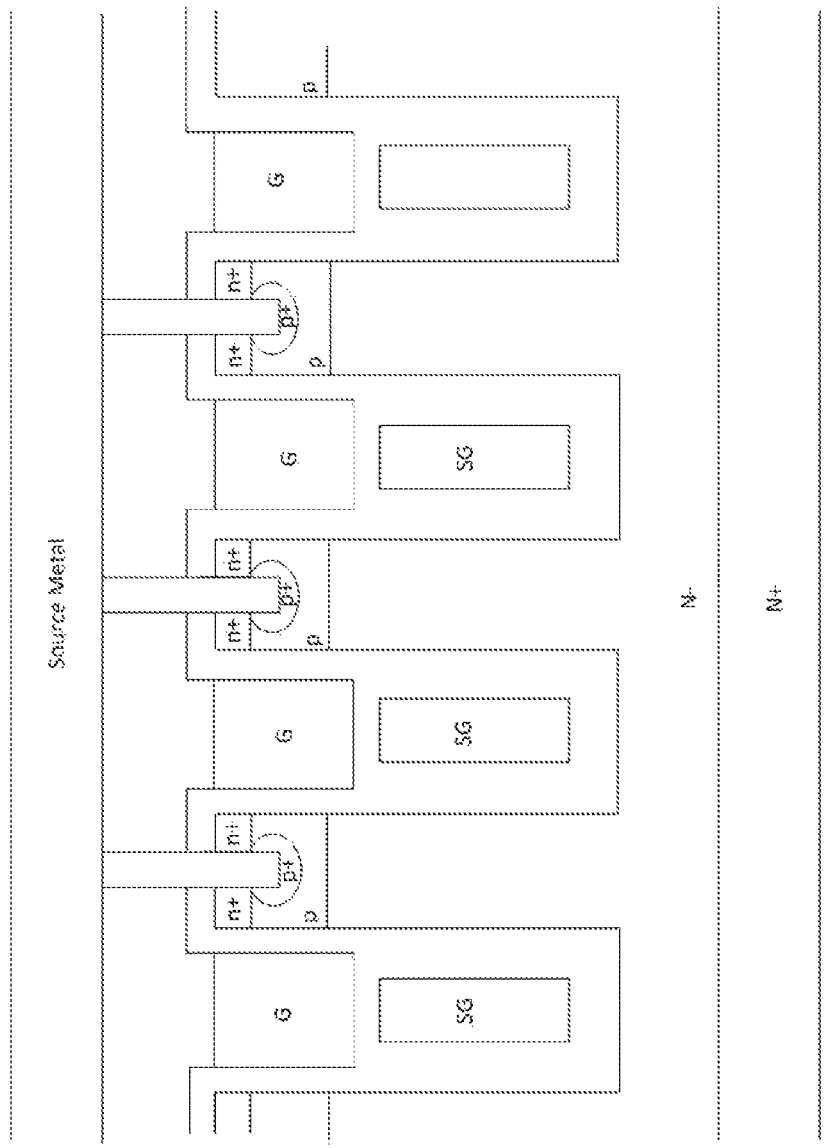
FIG. 1A is a cross-sectional view of a conventional SGT MOSFET of prior art.
Figure 1B:
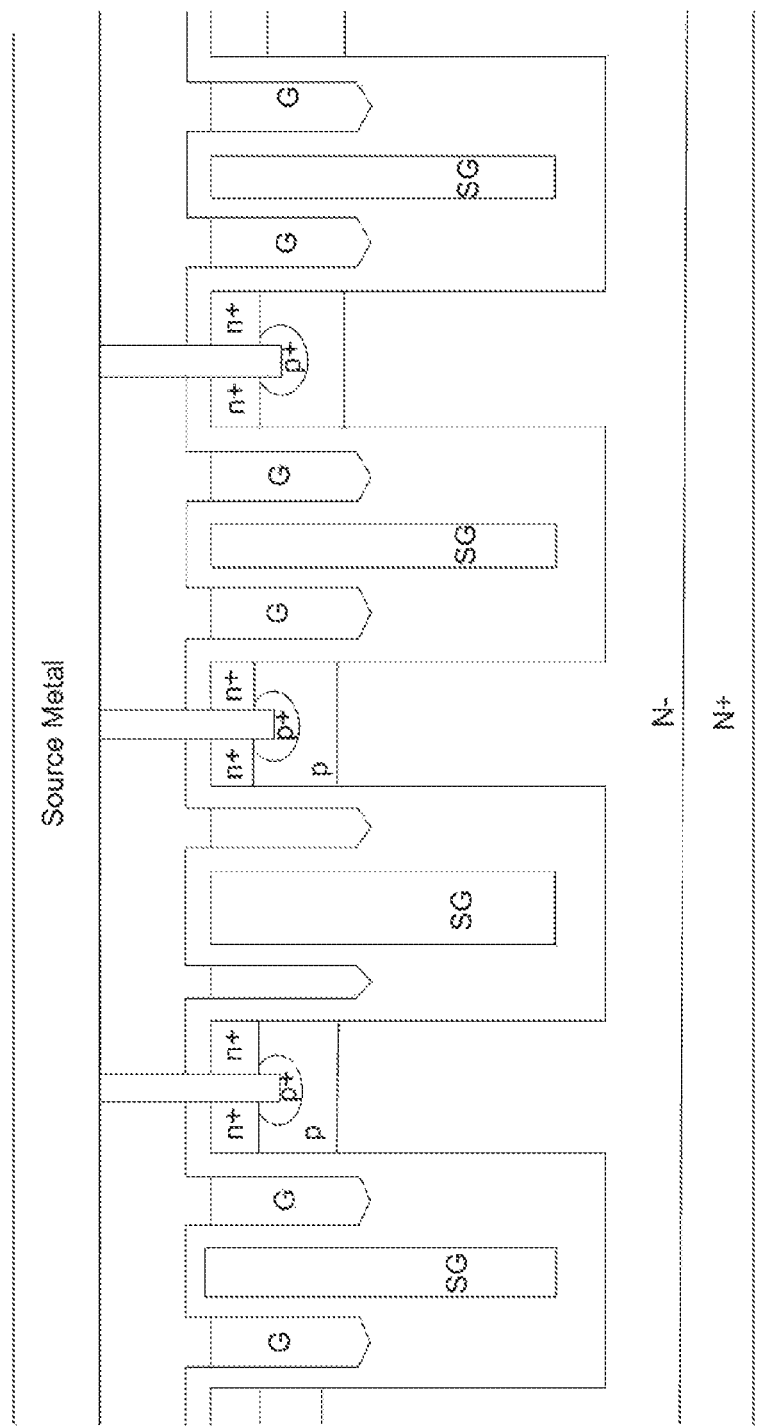
FIG. 1B is a cross-sectional view of another conventional SGT MOSFET of prior art.
Figure 1C:
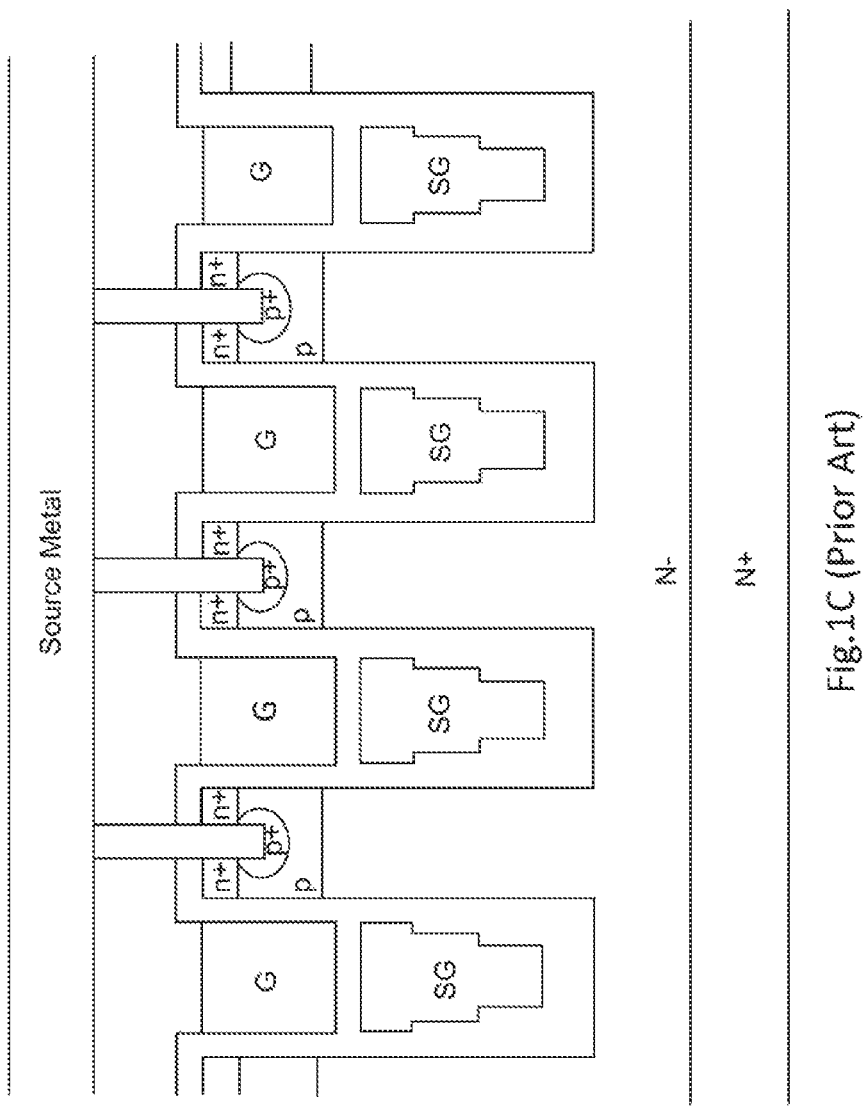
FIG. 1C is a cross-sectional view of MSO MOSFET of prior art.
Figure 2A:
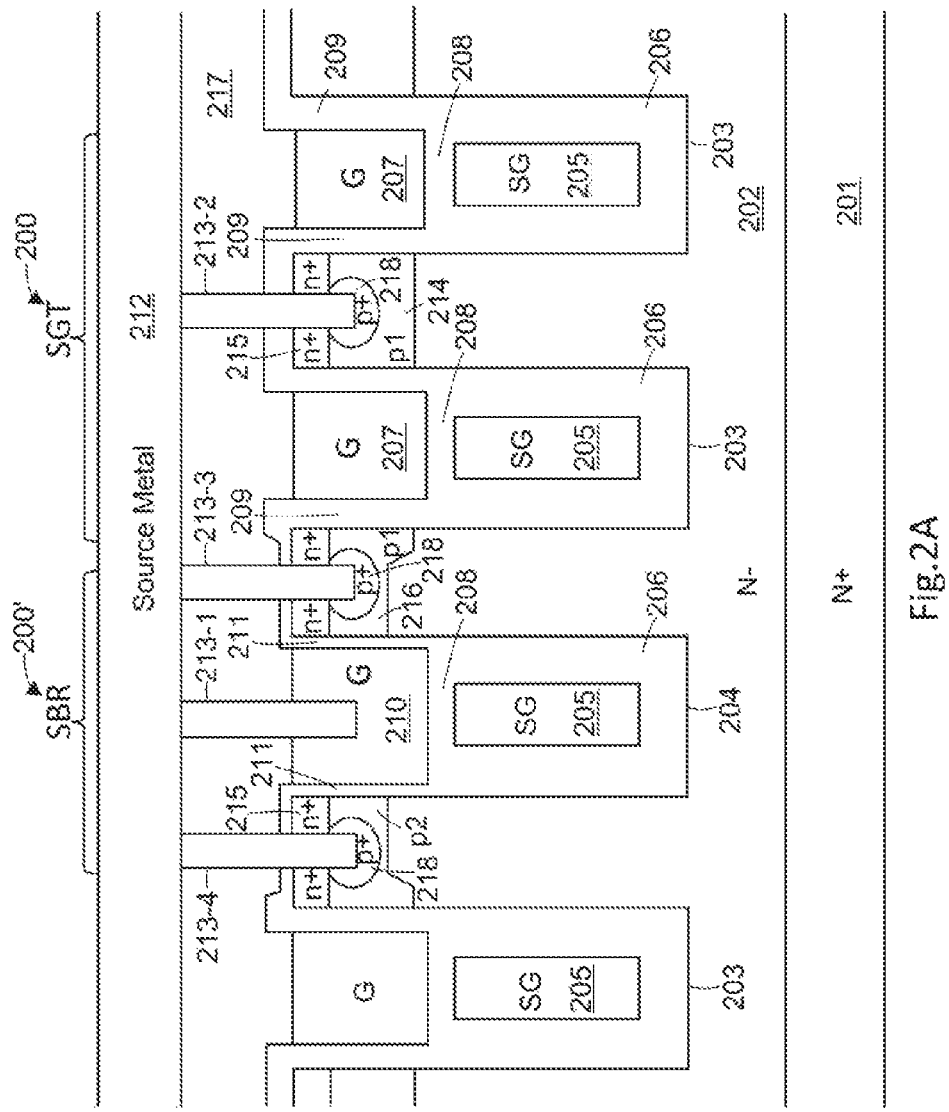
FIG. 2A is a cross-sectional view of a preferred embodiment according to the present invention.

Please refer to FIG. 2A for a preferred embodiment of this invention wherein an N-channel SGT MOSFET 200 and a SBR 200' are integrated on a single chip which is formed on an N+ substrate 201 with a less doped single N− epitaxial layer 202 extending thereon. Inside the N epitaxial layer 201, a plurality of first type trenches 203 and at least one second type trench 204 are formed vertically downward, each filled with a shielded gate structure comprising a shielded electrode 205 (SG, as illustrated) padded by a first insulating film 206 in lower portion. The difference of the filling-in structure between the first and the second type trenches is that: the first type trenches 203 comprise a first gate electrode 207 which is isolated from the shielded electrode 205 by a second insulating film 208 while insulated from the N− epitaxial layer by a first gate oxide film 209, and the first gate electrode 207 is further connected to a gate metal (not shown) of the SGT 200; the second type trench 204 comprises a second gate electrode 210 which is isolate from the shielded electrode 205 by the second insulating film 208 while insulated from the N− epitaxial layer by a second gate oxide film 211, wherein the second gate oxide film 211 has a thickness less than the first gate oxide film 209 for formation of SBR, and furthermore, the second gate electrode 210 is connected to a source metal 212 through a trenched contact 213-1. In the SGT MOSFET, a p1 body region 214 having a n+ source region 215 thereon is extending in upper portion of the N− epitaxial layer and surrounding the first gate electrodes 207 padded by the first gate oxide film 209, while in the SBR, a p2 body region 216 having the n+ source region 215 thereon is extending in upper portion of the N− epitaxial layer and surrounding the second gate electrode 210 padded by the second gate oxide film 211, wherein the p2 body region 216 has a shallower junction depth and a lower doping concentration than the p1 body region 214 to provide a short channel length for the SBR. The p1 body region 214, the p2 body region 216 and the n+ source region both in the SGT and SBR are shorted to the source metal 212 through a plurality of trenched contacts 213-2, 213-3 and 213-4, respectively. All the trenched contacts (213-1-213-4) filled with metal plug and barriers are implemented by penetrating through a contact insulating layer 217 and extending into the body region, with each bottom surrounded by a p+ body contact region 218. Trench width and depth of the second type trench 204 are equal to or wider than the first type trenches 203 to avoid early breakdown occurring at the SBR region.

Figure 2B:
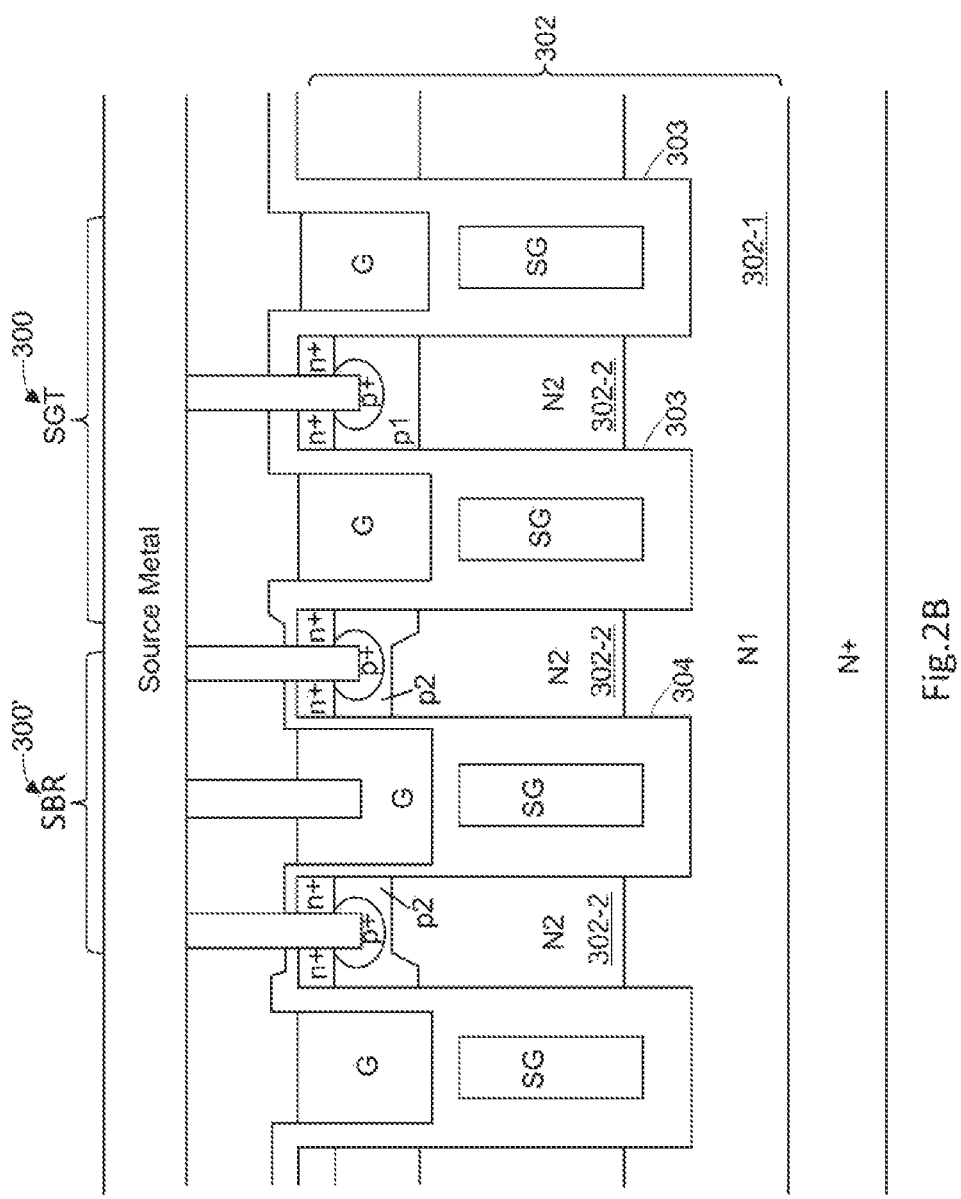
FIG. 2B is a cross-sectional view of another preferred embodiment according to the present invention.

Please refer to FIG. 2B for another preferred embodiment of the present invention, compared with FIG. 2A, the integrated circuit in FIG. 2B comprising a SGT MOSFET 300 and a SBR 300' is formed in an epitaxial layer 302, which further comprises a lower N1 epitaxial layer 302-1 with a resistivity R1 and an upper N2 epitaxial layer 302-2 with a resistivity R2, the first type trenches 303 in SGT and the second type trench 304 in SBR are all penetrating through the upper epitaxial layer 302-2 and having trench bottoms within the lower epitaxial layer 302-1. In this embodiment, the resistivity has a function relationship that R1>R2, to provide a higher resistivity epitaxial layer near the trench bottom corners for preventing an early breakdown, while to provide a lower resistivity epitaxial layer above the trench bottom to achieve a reduced device resistance.

Figure 2C:
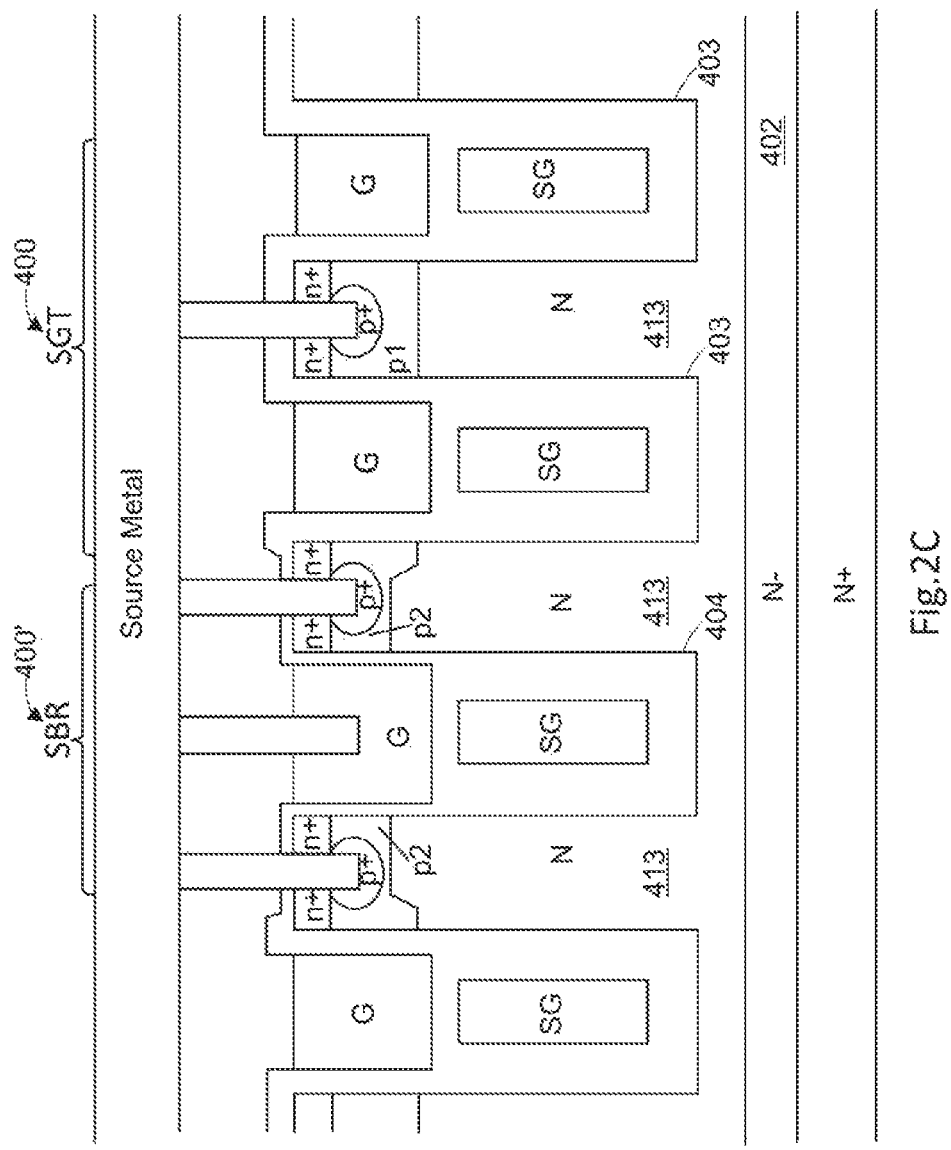
FIG. 2C is a cross-sectional view of another preferred embodiment according to the present invention.

Please refer to FIG. 2C for another preferred embodiment of the present invention, compared with FIG. 2A, the integrated circuit in FIG. 2C comprising a SGT MOSFET 400 and a SBR 400' is formed in an N– epitaxial layer 402, which further comprises an N implanted drift region 413 thereon. The first type trenches 403 in SGT and the second type trench 404 in SBR are all surrounded by the N implanted drift region 413, because in the manufacturing process, the N implanted drift region 413 is formed by performing angle implantation from opening of the first and second type trenches into mesa area between the trenches, or by performing implantation from top of the mesa area between the first and second type trenches.

Figure 3A:
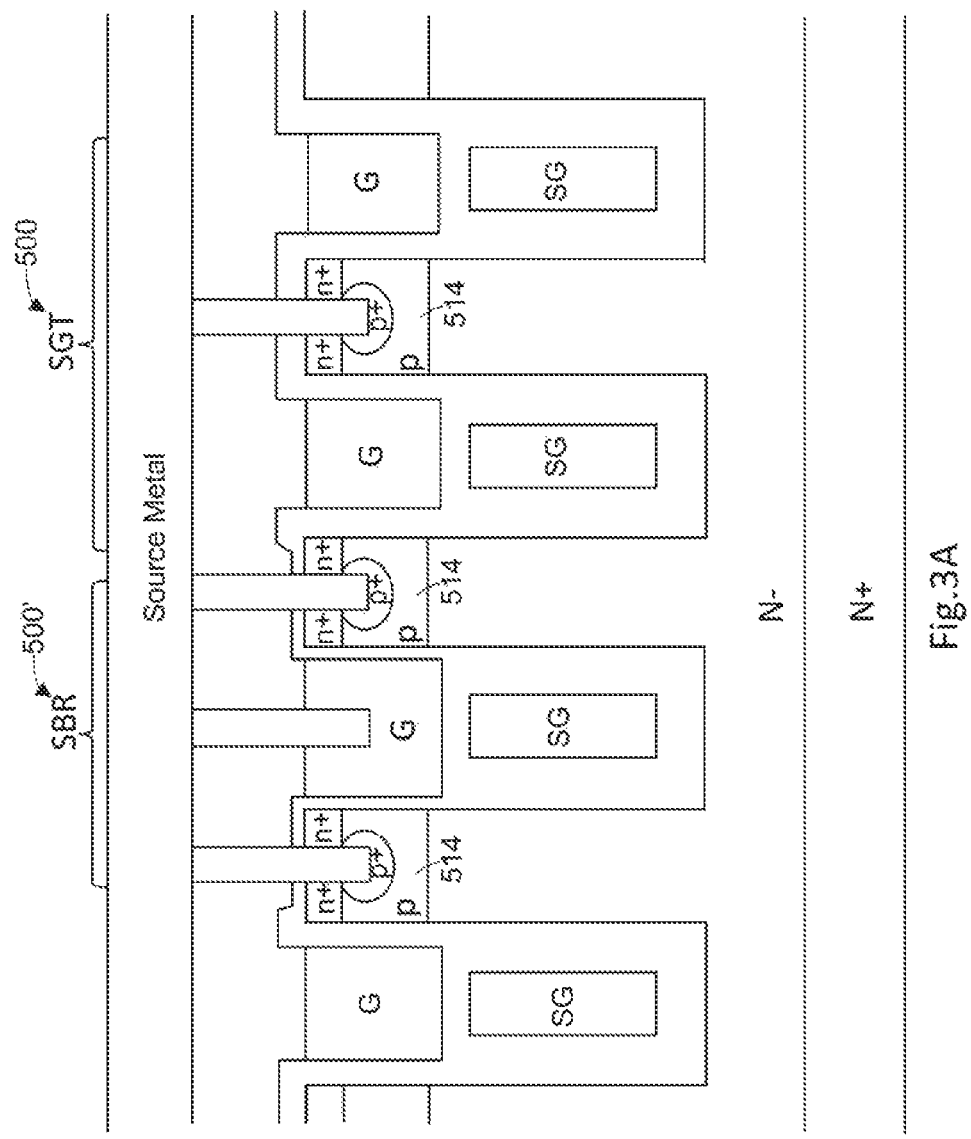
FIG. 3A is a cross-sectional view of another preferred embodiment according to the present invention.

FIG. 3A shows another preferred embodiment of the present invention, wherein an integrated circuit comprising an N-channel SGT MOSFE 500 and a SBR 500' has a similar device structure to FIG. 2A, except that, in FIG. 3A, the p body region 514 in the SBR 500' has a same junction depth and same doping concentration as in the SGT MOSFET 500 for preventing the short channel region in FIG. 2A from punching through.

Figure 3B:
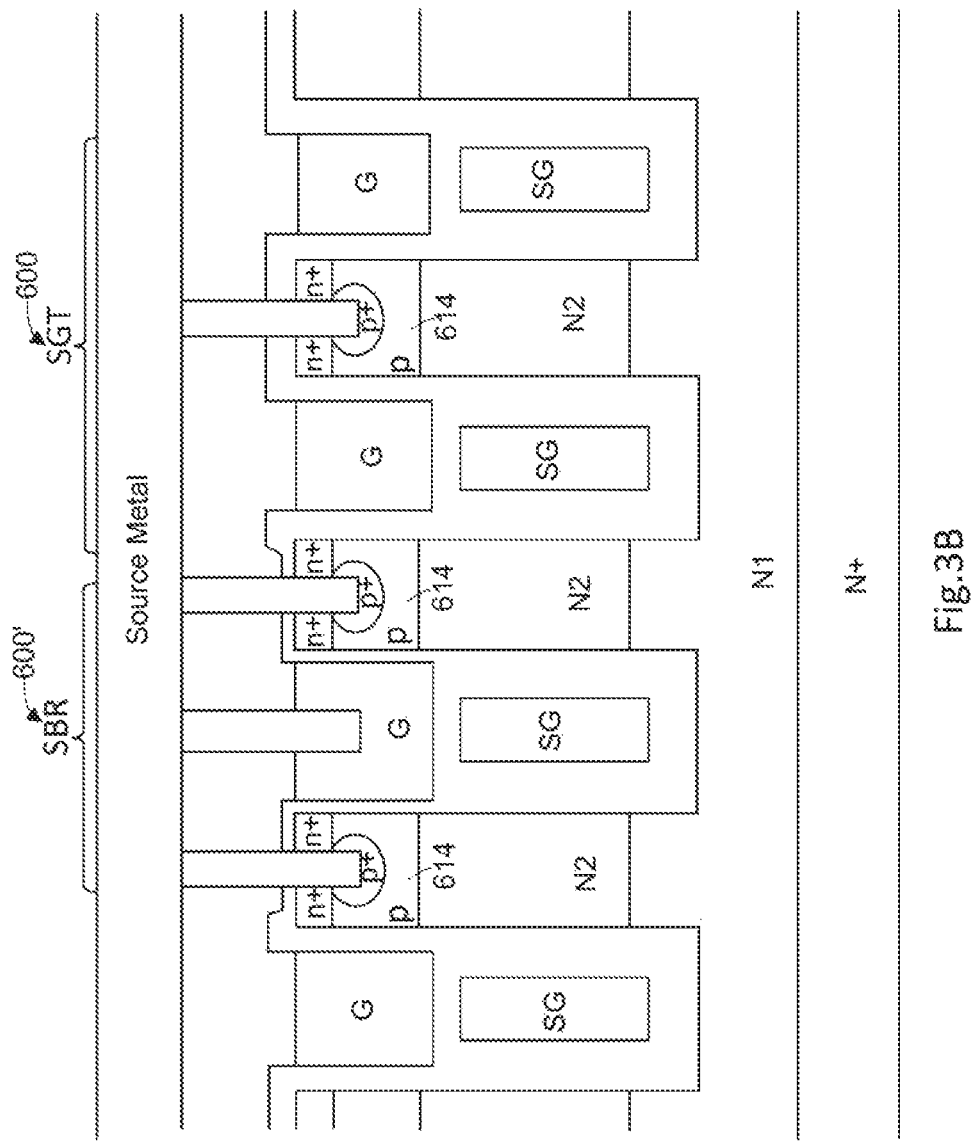
FIG. 3B is a cross-sectional view of another preferred embodiment according to the present invention.

FIG. 3B shows another preferred embodiment of the present invention, wherein an integrated circuit comprising an N-channel SGT MOSFET 600 and a SBR 600' has a similar device structure to FIG. 2B, except that, in FIG. 3B, the p body region 614 in the SBR 600' has a same junction depth and same doping concentration as in the SGT MOSFET 600 for preventing the short channel region in FIG. 2B from punching through.

Figure 3C:
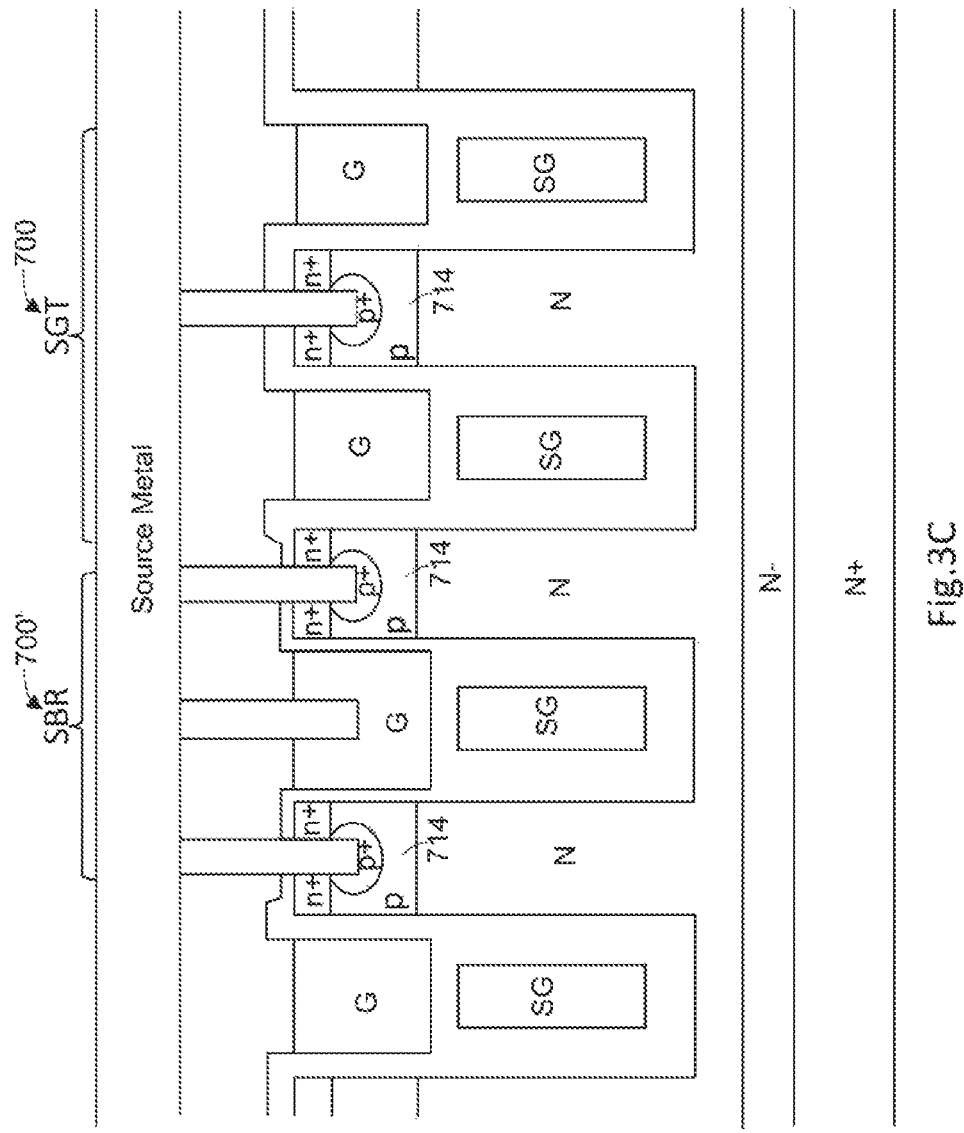
FIG. 3C is a cross-sectional view of another preferred embodiment according to the present invention.

FIG. 3C shows another preferred embodiment of the present invention, wherein an integrated circuit comprising an N-channel SGT MOSFET 700 and a SBR 700' has a similar device structure to FIG. 2C, except that, in FIG. 3C, the p body region 714 in the SBR 700' has a same junction depth and same doping concentration as in the SGT MOFET 700 for preventing the short channel region in FIG. 2C from punching through.

Figure 4:
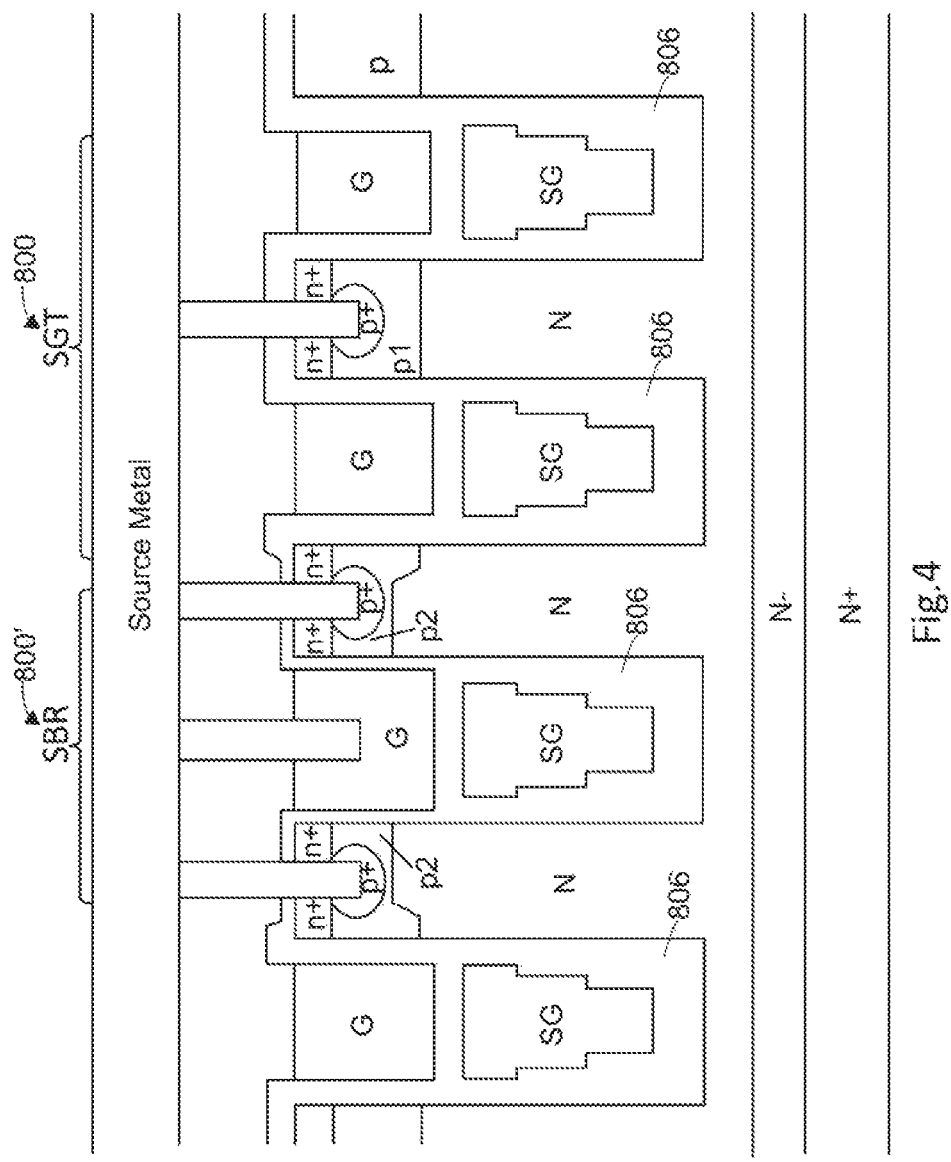
FIG. 4 is a cross-sectional view of another preferred embodiment according to the present invention.

FIG. 4 shows another preferred embodiment of the present invention, wherein an integrated circuit comprising an N-channel SGT MOSFET 800 and a SBR 800' has a similar device structure to FIG. 2C, except that, in FIG. 4, the first insulating film 806 in all the trenches has MSO structure to further reduce the on-resistance while maintaining the same breakdown voltage. As shown in FIG. 4, the first insulating film 806 has a greatest thickness along bottoms of all the trenches.

Figure 5:
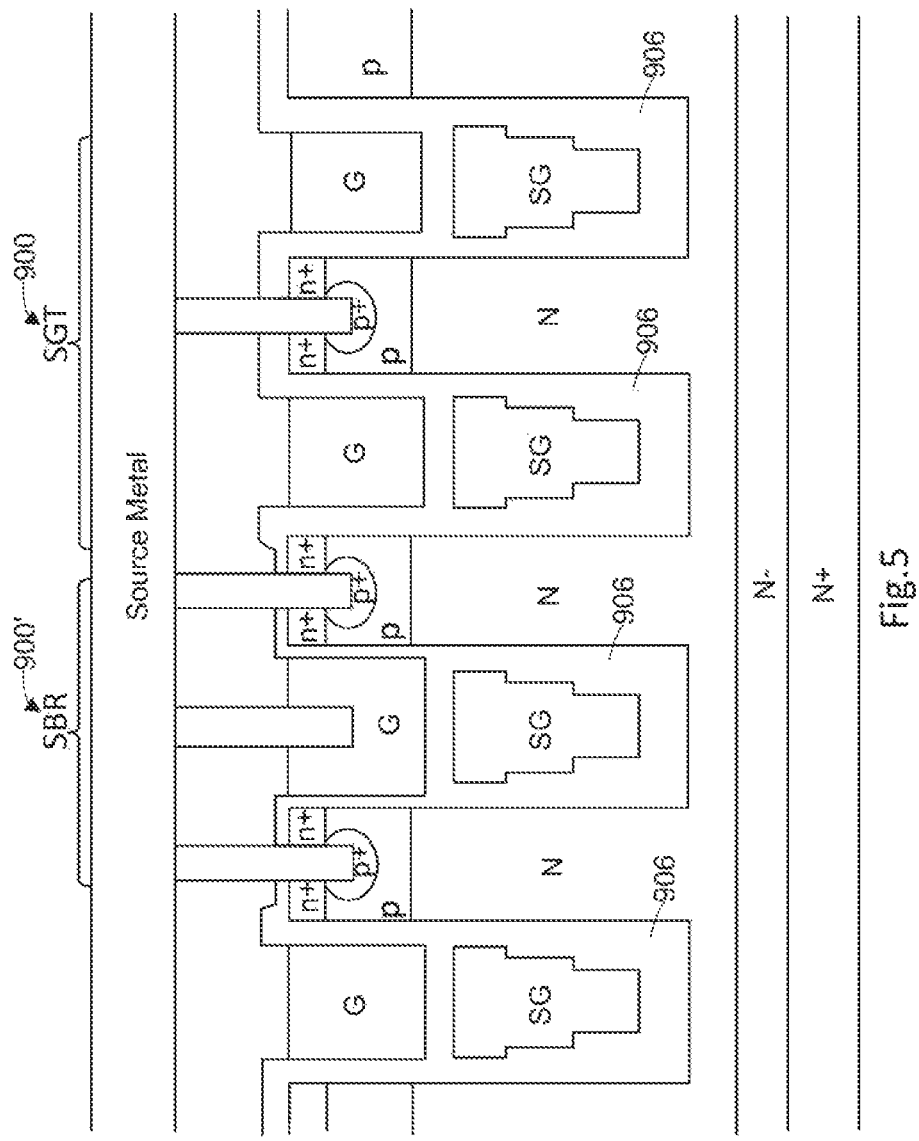
FIG. 5 is a cross-sectional view of another preferred embodiment according to the present invention.

FIG. 5 shows another preferred embodiment of the present invention, wherein an integrated circuit comprising an N-channel SGT MOSFET 900 and a SBR 900' has a similar device structure to FIG. 3C, except that, in FIG. 5, the first insulting film 906 in all the trenches has MSO structure to further reduce the on-resistance while maintaining the same breakdown voltage. As shown in FIG. 5, the first insulating film 806 has a greatest thickness along bottoms of all the trenches.

FIG. 6A shows another preferred embodiment of the present invention, wherein an integrated circuit comprising an N-channel SGT MOSFET 1000 and a SBR 1000' has a similar device structure to FIG. 2A, except that, in FIG. 6A, the first type trenches 1003 and the second type trench 1004 comprise a different shielded gate structure. In the first type trenches 1003 of the SGT MOSFET 1000, the shielded gate structure comprises: a shielded electrode 1005 disposed in the middle of the trench; a first gate electrode 1007 disposed in the middle of the shielded electrode 1005 and the trench sidewall in upper portion of the first type trenches 1003; wherein the shielded electrode 1005 is insulated from the N– epitaxial layer 1002 by a first insulating film 1006, the first gate electrode 1007 is isolated from the shielded electrode 1005 and the epitaxial layer by a first gate oxide film 1009. In the second type trench 1004 of the SBR 1000', the shielded gate structure comprises: the shielded electrode 1005 disposed in the middle of the trench 1004; a second gate electrode 1010 disposed in the middle of the shielded electrode 1005 and the trench sidewall in upper portion of the second type trench 1004; wherein the shielded electrode 1005 is insulated from the N– epitaxial layer 1002 by the first insulating film 1006, the second gate electrode 1010 is isolated from the shielded electrode 1005 and the epitaxial layer by a second gate oxide film 1011, wherein the second gate oxide film 1011 has a thickness less than the first gate oxide film 1009 for formation of the SBR 1000. Trench width and trench depth of the second type trench 1004 are equal to or greater than the first type trenches 1003 to avoid early breakdown occurring at the SBR region.

Figure 6B:
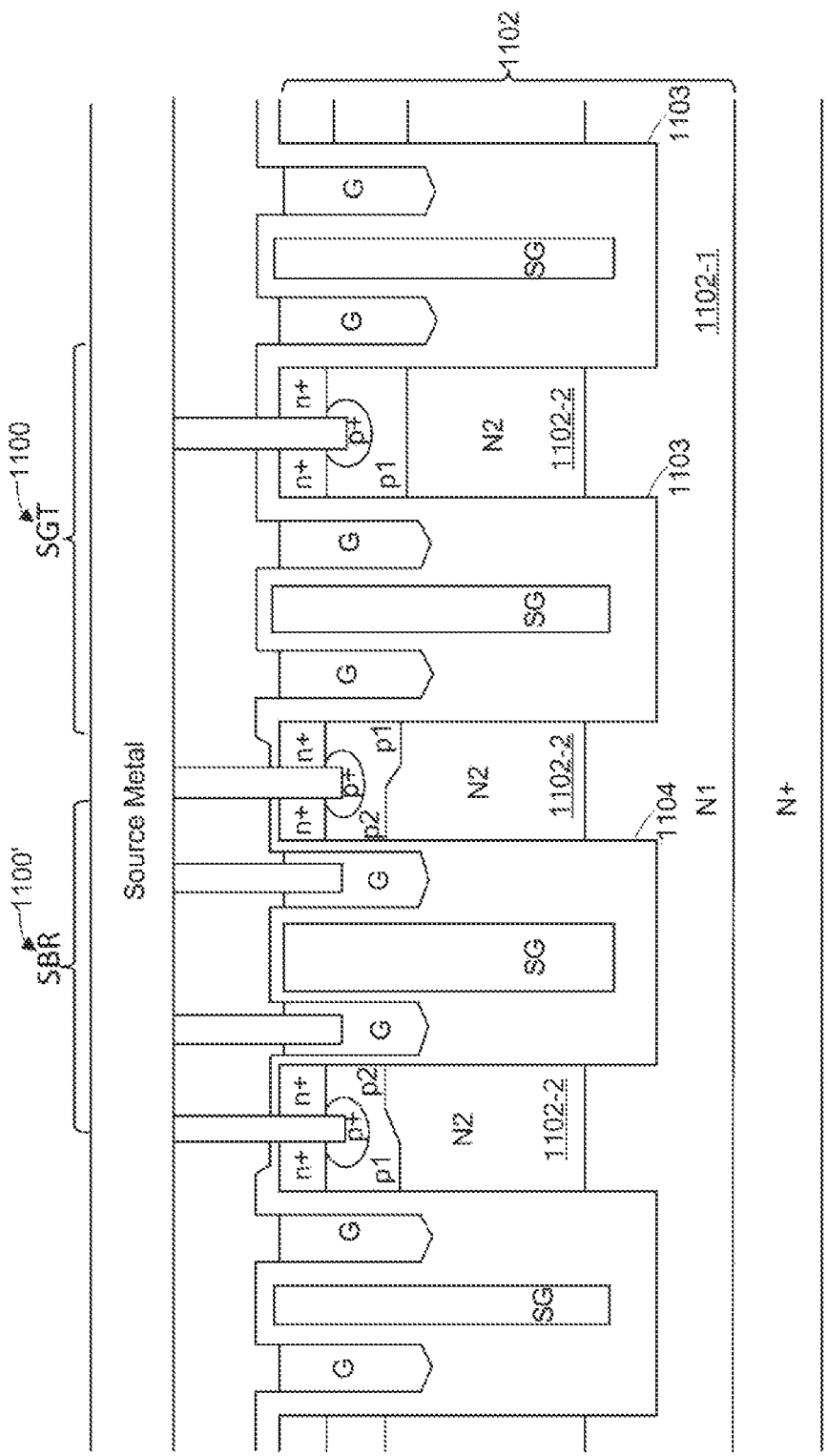
FIG. 6B is a cross-sectional view of another preferred embodiment according to the present invention.

Please refer to FIG. 6B for another preferred embodiment of the present invention, compared with FIG. 6A, the integrated circuit in FIG. 6B comprising an N-channel SGT MOSFET 1100 and a SBR 1100' is formed in an epitaxial layer 1102, which further comprises a lower N1 epitaxial layer 1102-1 with a resistivity R1 and an upper N2 epitaxial layer 1102-2 with a resistivity R2, the first type trenches 1103 in SGT and the second type trench 1104 in SBR are all penetrating through the upper epitaxial layer 1102-2 and having trench bottoms within the lower epitaxial layer 1102-1. In this embodiment, the resistivity has a function relationship that R1>R2, to provide a higher resistivity epitaxial layer near the trench bottom corners for preventing an early breakdown, while to provide a lower resistivity epitaxial layer above the trench bottom to achieve a reduced device resistance.

Figure 6C:
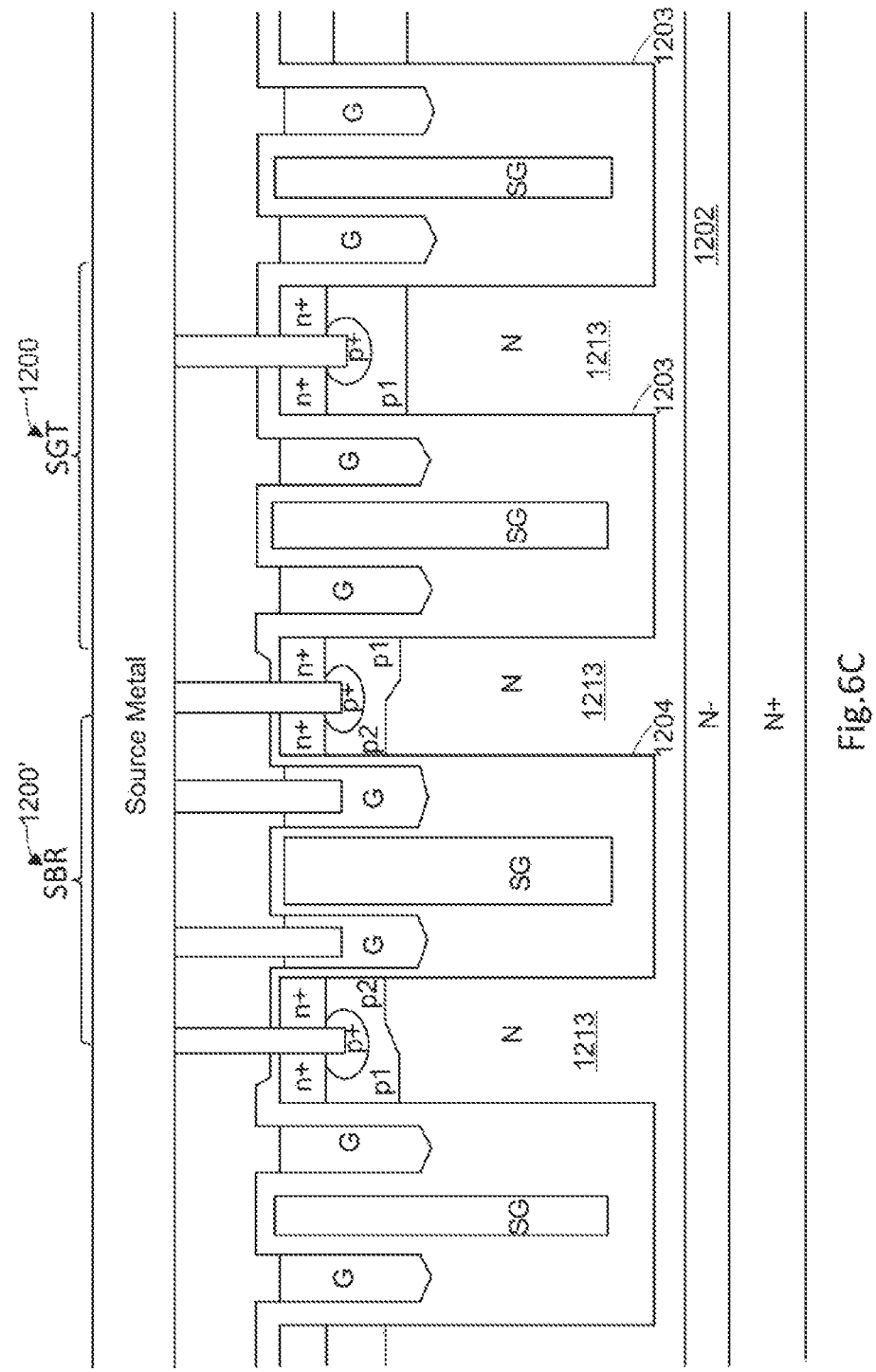
FIG. 6C is a cross-sectional view of another preferred embodiment according to the present invention.

Please refer to FIG. 6C for another preferred embodiment of the present invention, compared with FIG. 6A, the integrated circuit in FIG. 6C comprising an N-channel SGT MOSFET 1200 and a SBR 1200' is formed in an N– epitaxial layer 1202, which further comprises an N implanted drift region 1213 thereon. The first type trenches 1203 in SGT and the second type trench 1204 in SBR are all surrounded by the N implanted drift region 1213, because in the manufacturing process, the N implanted drift region 1213 is formed by performing angle implantation from opening of the first and second type trenches into mesa area between the trenches, or by performing implantation from top of the mesa area between the first and second type trenches.

Figure 7A:
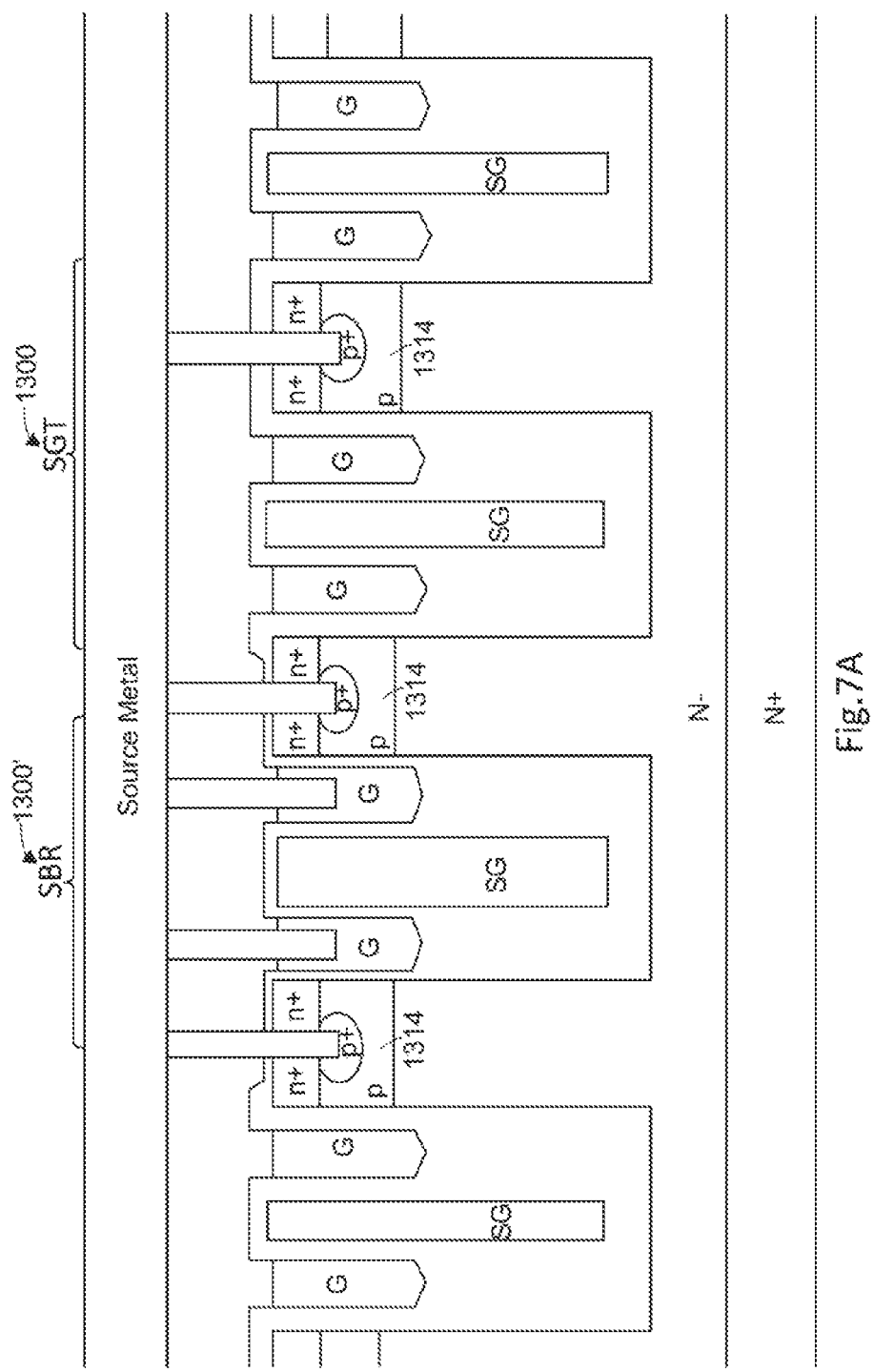
FIG. 7A is a cross-sectional view of another preferred embodiment according to the present invention.

FIG. 7A shows another preferred embodiment of the present invention, wherein an integrated circuit comprising an N-channel SGT MOSFE 1300 and a SBR 1300' has a similar device structure to FIG. 6A, except that, in FIG. 7A, the p body region 1314 in the SBR 1300' has a same junction depth and same doping concentration as in the SGT MOSFET 1300 for preventing the short channel region in FIG. 6A from punching through.

Figure 7B:
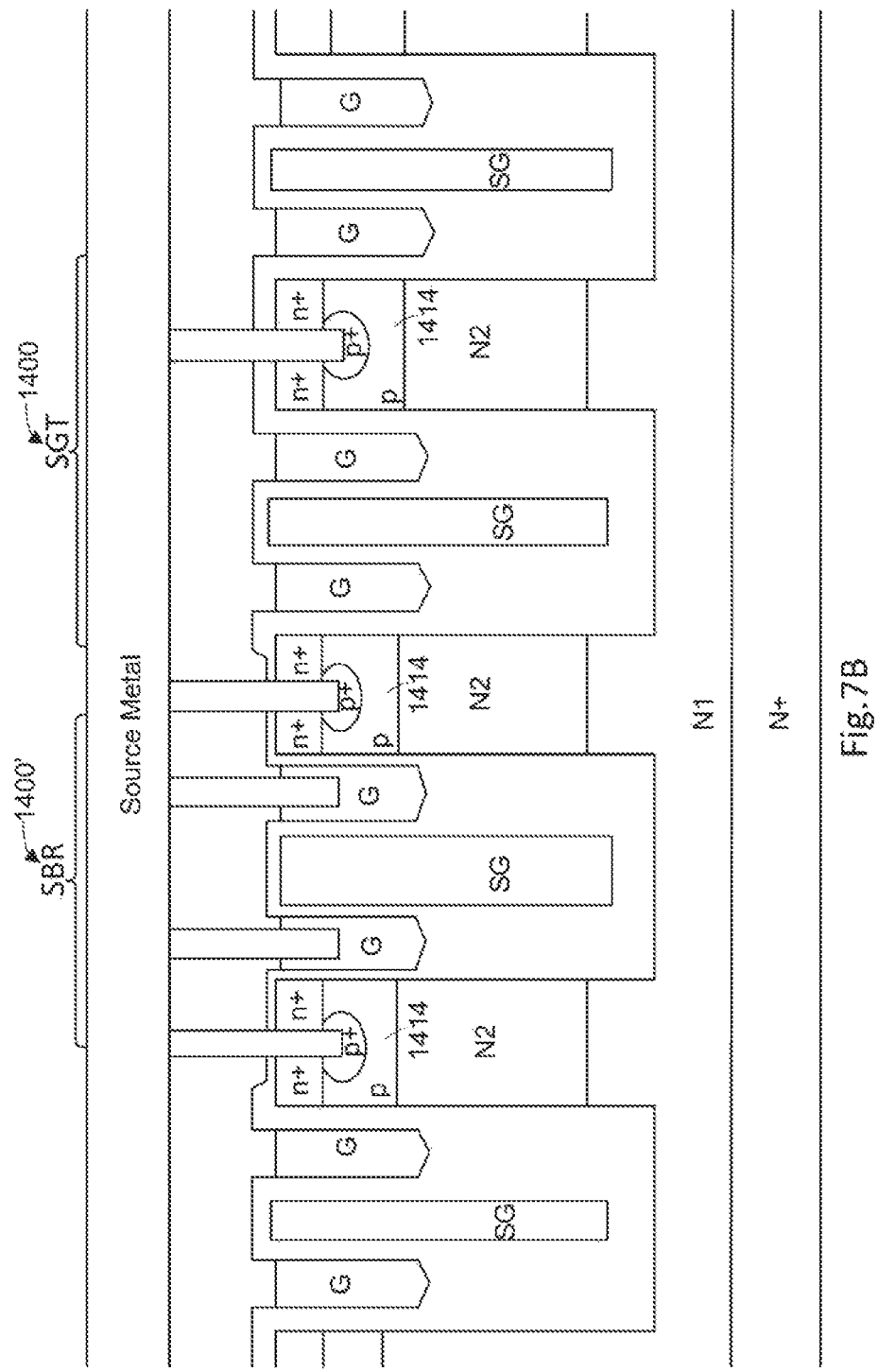
FIG. 7B is a cross-sectional view of another preferred embodiment according to the present invention.

FIG. 7B shows another preferred embodiment of the present invention, wherein an integrated circuit comprising an N-channel SGT MOSFET 1400 and a SBR 1400' has a similar device structure to FIG. 6B, except that, in FIG. 7B, the p body region 1414 in the SBR 1400' has a same junction depth and same doping concentration as in the SGT MOSFET 1400 for preventing the short channel region in FIG. 6B from punching through.

Figure 7C:
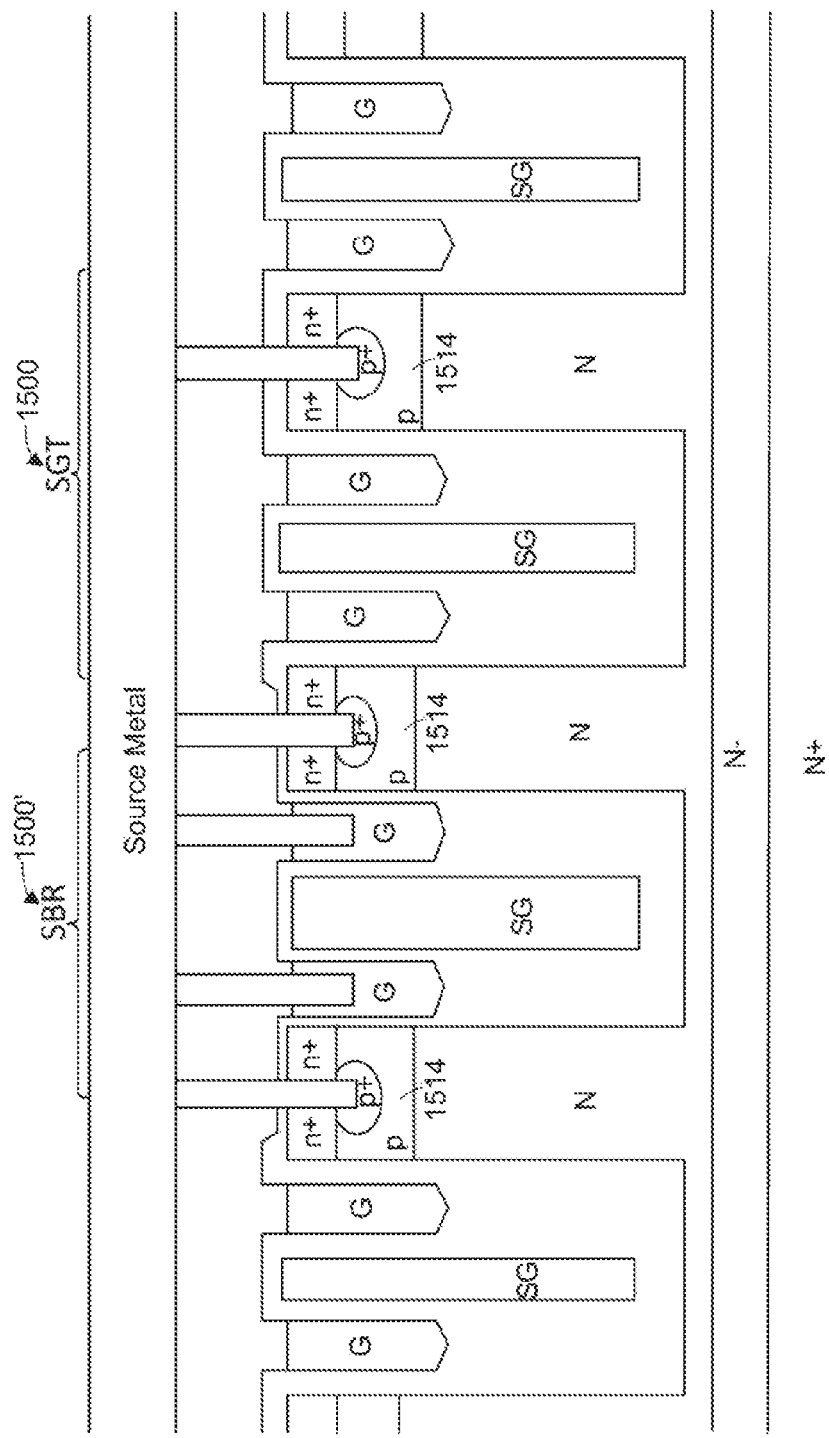
FIG. 7C is a cross-sectional view of another preferred embodiment according to the present invention.

FIG. 7C shows another preferred embodiment of the present invention, wherein an integrated circuit comprising an N-channel SGT MOSFET 1500 and a SBR 1500' has a similar device structure to FIG. 6C, except that, in FIG. 7C, the p body region 1514 in the SBR 1500' has a same junction depth and same doping concentration as in the SGT MOFET 1500 for preventing the short channel region in FIG. 6C from punching through.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. An integrated circuit comprising a shielded gate trench metal oxide semiconductor transistor (SGT MOSFET) and a super barrier rectifier (SBR) horizontally disposed in two different areas on a single chip, further comprising:
    an epitaxial layer of a first conductivity type extending over a substrate of said first conductivity type, said substrate having a higher doping concentration than said epitaxial layer;
    said SGT MOSFET further comprising:
    a plurality of first type trenches formed in said epitaxial layer, each of said first type trenches being filled with a first shielded electrode and a first gate electrode, said shielded electrode being insulated from said epitaxial layer by a first insulating film, said first gate electrode being insulated from said epitaxial layer by a first gate oxide film, said first shielded electrode and said first gate electrode being insulated from each other;
    a first body region of a second conductivity type having a first source region of said first conductivity type thereon and surrounding said first gate electrode padded by said first gate oxide film;
    said SBR further comprising:
    at least one second type trench formed in parallel with said first type trenches, said second type trench being filled with said a second shielded electrode and a second gate electrode, said second shielded electrode being insulated from said epitaxial layer by a second insulating film, said second gate electrode being insulated from said epitaxial layer by a second gate oxide film, said second shielded electrode and said second gate electrode being insulated from each other;
    said second gate oxide film having a thickness less than said first gate oxide film; a second body region of said second conductivity type having a second source region thereon and surrounding said second gate electrode padded by said second gate oxide film;
    said first body region, said second body region, said first and second source regions and said second gate electrode being shorted to a source metal through a plurality of trenched contacts; and
    said second body region has a shallower junction depth and a lower doping concentration than said first body region.

2. The integrated circuit of claim 1, wherein said epitaxial layer comprises a single epitaxial layer having a uniform doping concentration.

3. The integrated circuit of claim 1, wherein said epitaxial layer comprises a lower epitaxial layer with a resistivity R1 and an upper epitaxial layer with a resistivity R2, wherein R1>R2, said first and second type trenches are penetrating through said upper epitaxial layer and extending into said lower epitaxial layer.

4. The integrated circuit of claim 1, wherein said epitaxial layer further comprises an implanted drift region of said first conductivity type formed in an upper portion of said epitaxial layer, said first and second type trenches are extending within said implanted drift region.

5. The integrated circuit of claim 1, wherein within each of said first type trenches, said first shielded electrode is disposed in a lower portion and said first gate electrode is disposed in an upper portion, said first shielded electrode and said first gate electrode are insulated from each other by a third insulating film;
    within said second type trench, said second shielded electrode is disposed in a lower portion and said second gate electrode is disposed in an upper portion, said second shielded electrode and said second gate electrode are insulated from each other by a fourth insulating film.

6. The integrated circuit of claim 5, wherein said first insulating film is a single oxide film having a uniform thickness.

7. The integrated circuit of claim 5, wherein each of said first and second insulating films have multiple stepped oxide structures having a greatest thickness along a bottom of said first and second type trenches, accordingly.

8. The integrated circuit of claim 1, wherein said second type trench has a trench width and a trench depth same as said first type trenches.

* * * * *